United States Patent
Oefner et al.

(10) Patent No.: US 9,721,907 B2
(45) Date of Patent: Aug. 1, 2017

(54) WAFER EDGE SHAPE FOR THIN WAFER PROCESSING

(71) Applicant: Infineon Technologies AG, Neubiberg (DE)

(72) Inventors: Helmut Oefner, Zorneding (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/945,115

(22) Filed: Nov. 18, 2015

(65) Prior Publication Data

US 2017/0141049 A1    May 18, 2017

(51) Int. Cl.
| | |
|---|---|
| *H01L 29/02* | (2006.01) |
| *H01L 21/302* | (2006.01) |
| *H01L 23/00* | (2006.01) |
| *H01L 21/02* | (2006.01) |
| *H01L 21/304* | (2006.01) |

(52) U.S. Cl.
CPC ...... *H01L 23/562* (2013.01); *H01L 21/02035* (2013.01); *H01L 21/304* (2013.01)

(58) Field of Classification Search
CPC .................................................. H01L 21/02021
See application file for complete search history.

(56) References Cited

U.S. PATENT DOCUMENTS

| | | |
|---|---|---|
| 7,258,931 B2 | 8/2007 | Kim et al. |
| 2012/0187547 A1 | 7/2012 | Nemoto et al. |
| 2012/0241916 A1 | 9/2012 | Daubenspeck et al. |

*Primary Examiner* — Alexander Ghyka
(74) *Attorney, Agent, or Firm* — Dicke, Billig & Czaja, PLLC (57) ABSTRACT

A wafer that includes a front surface, a back surface, and an edge between the front surface and the back surface having a curved edge profile between an edge of the front surface and a side face of the edge of the wafer. The edge profile includes a first convex curve that joins the edge of the front surface, a second convex curve that joins the side face, and an intermediate concave curve that joins the first convex curve and the second convex curve.

23 Claims, 9 Drawing Sheets

WAFER EDGE SHAPE FOR THIN WAFER PROCESSING

TECHNICAL FIELD

The present application relates to a wafer, in particular, a wafer having a curved edge profile.

BACKGROUND

Semiconductor wafers such as monocrystalline silicon wafers are used to manufacture integrated circuits. The wafers are formed by slicing a cylindrical crystalline ingot into thin disc-shaped wafers. The square edges of the sliced wafers are rounded to reduce mechanical defects, such as edge chipping and cracking, that can occur during handling of the wafer. The rounding can be performed by a grinding process that utilizes a wafer edge grinding wheel. Because edge chipping and cracking can increase stress and facilitate the onset of wafer breakage or deformation during thermal processing, the rounding will improve wafer yields. Typically a larger radius of edge rounding leads to more mechanical stability.

Wafers are available in sizes that range from 25 millimeters (1 inch) to 300 millimeters (12 inches) and have corresponding thicknesses that range from 300 microns to 800 microns. If the wafers require thinning during the manufacturing process, the stress reduction benefit of the original rounding of the thick wafer edge will be lost if the value of the final thickness goes below the radius of the original edge rounding. For example, if 300 millimeter wafers have an edge rounding radius of 200 microns and are thinned to a final thickness of 100 microns or less, the resulting sharp wafer edges will be mechanically unstable during subsequent steps in the manufacturing process, thereby leading to increased wafer yield losses.

One approach that has been used is to round the edges of the wafer in proportion to the wafer's expected target thickness after thinning. However, wafers having edges rounded to radius of curvatures that are relatively small in proportion to their initial thickness will be more susceptible to mechanical damage during handling before they are thinned to their target thickness. This problem will become worse over time as semiconductor industry roadmaps for wafer target thicknesses after thinning are already projecting thicknesses that are well below 100 microns.

SUMMARY

According to an embodiment of a wafer, the wafer includes a front surface, a back surface, and an edge between the front surface and the back surface having a curved edge profile between an edge of the front surface and a side face of the edge of the wafer. The edge profile includes a first convex curve that joins the edge of the front surface, a second convex curve that joins the side face, and an intermediate concave curve that joins the first convex curve and the second convex curve.

According to an embodiment of a wafer, the wafer includes a front surface, a back surface, and a circumferential edge between the front surface and the back surface having a curved edge profile between an edge of the front surface and a side face of the circumferential edge of the wafer. The edge profile includes a first convex curve that joins the edge of the front surface at a first radial distance from the side face. The edge profile includes a second convex curve that joins the side face. The edge profile includes an intermediate concave curve between the first convex curve and the second convex curve that joins the first convex curve at a second radial distance from the side face and joins the second convex curve at a third radial distance from the side face. The first radial distance is greater than the second radial distance and the second radial distance is greater than the third radial distance.

According to an embodiment of a method of forming a wafer, the method includes providing a wafer that includes a front surface, a back surface, and an edge between the front surface and the back surface, and forming a curved edge profile between an edge of the front surface and a side face of the edge of the wafer. The curved edge profile includes a first convex curve that joins the edge of the front surface, a second convex curve that joins the side face, and an intermediate concave curve that joins the first convex curve and the second convex curve.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION OF ILLUSTRATIVE EMBODIMENTS

Figure 1:
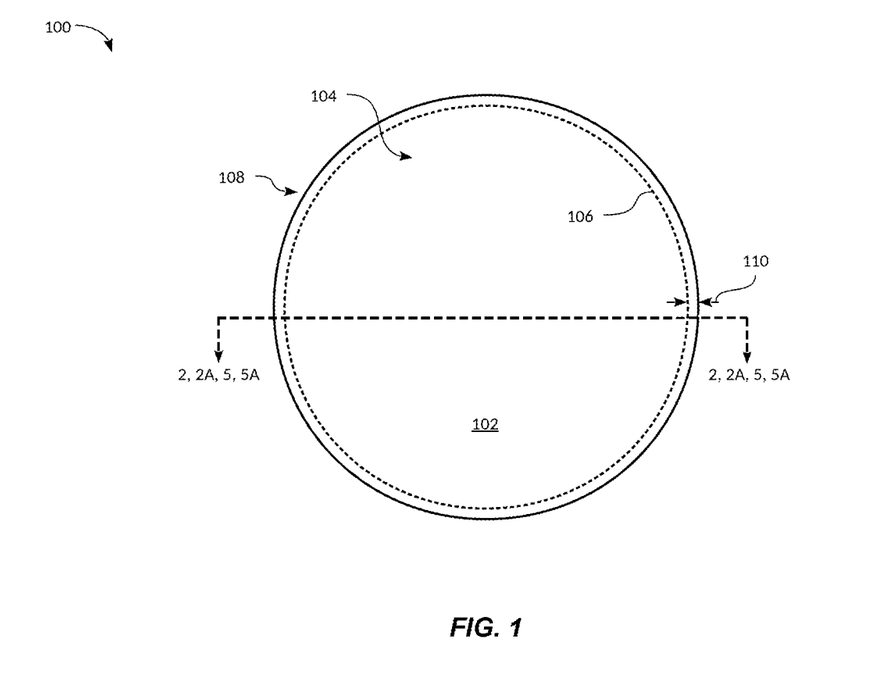
FIG. 1 illustrates a top plan view of an embodiment of a wafer having a curved edge profile.

FIG. 1 illustrates a top plan view of an embodiment of a wafer at 100. A cros s-sectional view of wafer 100 is illustrated in FIG. 2, FIG. 2A, FIG. 5 and FIG. 5A by a dashed line in FIG. 1 that references FIG. 2, FIG. 2A, FIG. 5 and FIG. 5A. In the illustrated embodiment, wafer 100 includes a substrate 102. In one embodiment, substrate 102 is a silicon (Si) substrate. In other embodiments, substrate 102 can be formed from other suitable materials that include, but are not limited to, Silicon Germanium (SiGe), Silicon on Insulator (SOI), Silicon Carbide (SiC), Gallium Arsenide (GaAs) and Gallium Nitride (GaN).

In the illustrated embodiment, wafer 100 includes a front surface 104 that has an edge 106. Wafer 100 further includes an edge 108 that is between front surface 104 and the back surface (not illustrated, refer to FIG. 2). In the illustrated embodiment, edge 108 is a circumferential edge 108. In other embodiments, edge 108 can have other suitable shapes. In the illustrated embodiment, edge 108 includes a curved edge profile 110 between edge 106 of front surface 104 and a side face (not illustrated, refer to FIG. 2) of edge 108.

Figure 2:
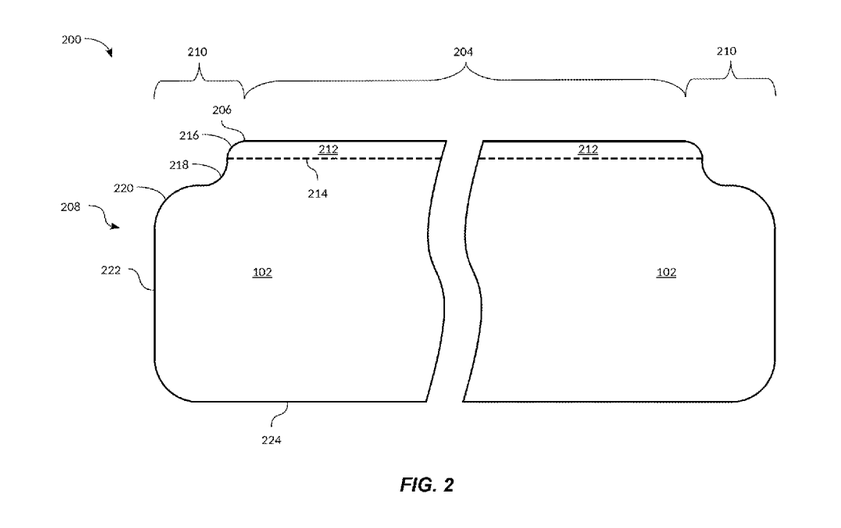
FIG. 2 illustrates a cross-sectional view of an embodiment of a wafer having a curved edge profile.

FIG. 2 illustrates at 200 a cross-sectional view of an embodiment of wafer 100 illustrated in FIG. 1. Wafer 200 includes a front surface 204, a back surface 224 and an edge 208 that is between front surface 204 and back surface 224. Edge 208 includes a curved edge profile 210 between edge 206 of front surface 204 and a side face 222 of edge 208. Edge profile 210 includes a first convex curve 216 that joins edge 206 of front surface 204, a second convex curve 220 that joins side face 222, and an intermediate concave curve 218 that joins the first convex curve 216 and the second convex curve 220.

FIG. 2 illustrates an embodiment of wafer 200 before wafer thinning has been performed. The dash line at 214 illustrates a final wafer thickness after wafer 200 has been thinned, and substrate portion 212 illustrates the portion of substrate 102 that remains after thinning. After thinning, substrate portion 212 of wafer 200 includes front surface 204 and first convex curve 216 that joins edge 206 of front surface 204. The dash line at 214 corresponds to back surface 314 of wafer 300 (refer to FIG. 3).

Figure 2A:
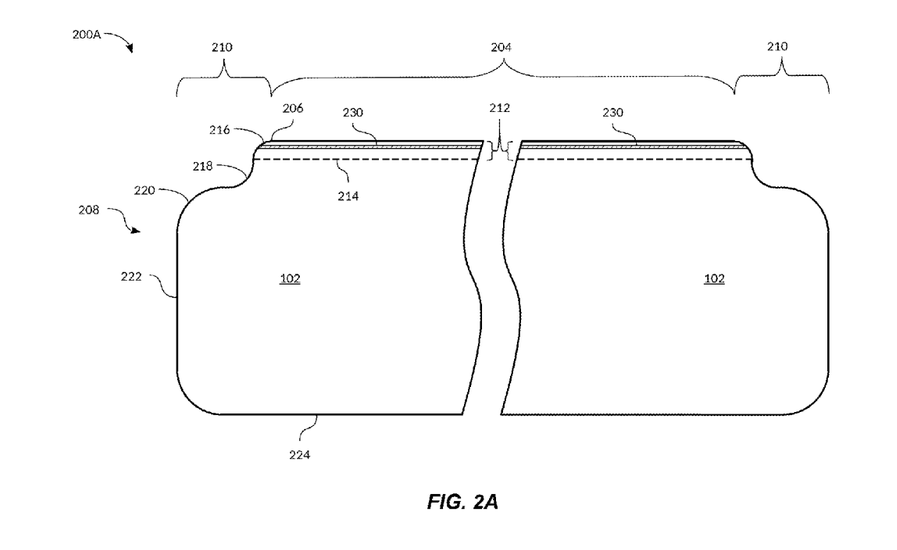
FIG. 2A illustrates a cross-sectional view of an embodiment of the wafer illustrated in FIG. 2.

FIG. 2A illustrates at 200A a cross-sectional view of an embodiment of wafer 200 illustrated in FIG. 2. In this embodiment, wafer 200 is an SOI wafer that includes a buried oxide layer 230. Buried oxide layer 230 is below front surface 204 and above dash line 214. In other embodiments, buried oxide layer 230 can be below dash line 214.

Figure 3:
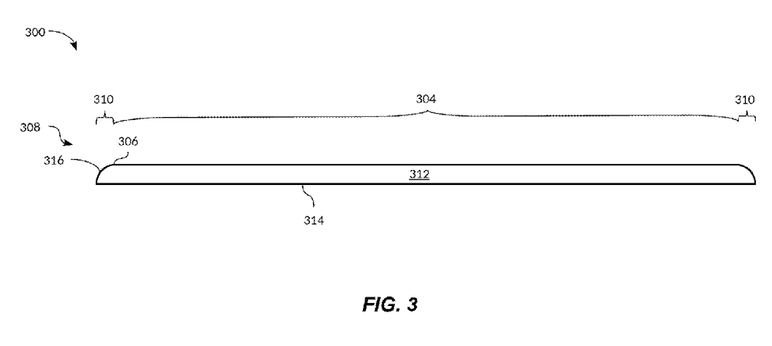
FIG. 3 illustrates a cross-sectional view of an embodiment of a wafer that has been thinned.

FIG. 3 illustrates a cross-sectional view of an embodiment of a wafer at 300 that has been thinned. In one embodiment, wafer 300 corresponds to wafer 200 after wafer 200 has been thinned. In one embodiment, wafer 300 corresponds to wafer 500 after wafer 500 has been thinned (refer to FIG. 5). In the illustrated embodiment, wafer 300 includes a substrate portion 312 and has a front surface 304, a back surface 314 and an edge 308 that is between front surface 304 and back surface 314. After thinning, edge profile 310 of edge 308 includes a first convex curve 316. In various embodiments, first convex curve 316 has a radius of curvature that is continuously changing between high values at endpoints where first convex curve 316 meets edge 306 and meets back surface 314, to a minimum value that is between edge 306 and back surface 314. In one embodiment, first convex curve 316 has a radius of curvature that does not change. In other embodiments, first convex curve 316 has a radius of curvature that is changing between one or more high values and one or more low values.

Figure 4:
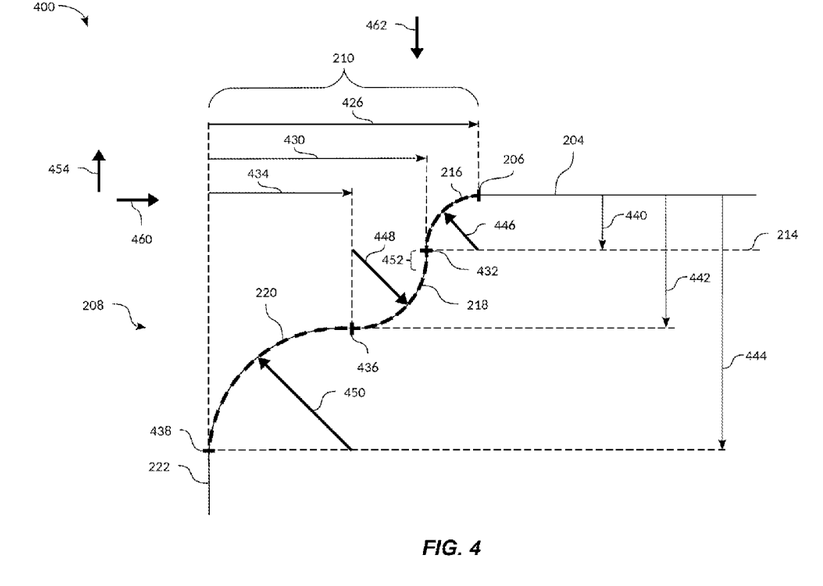
FIG. 4 illustrates a cross-sectional view of the embodiment of the curved edge profile illustrated in FIG. 2 and FIG. 2A.

FIG. 4 illustrates at 400 a cross-sectional view of the embodiment of the curved edge profile 210 illustrated in FIG. 2 and FIG. 2A. Edge 208 includes a curved edge profile 210 between edge 206 of front surface 204 and side face 222 of edge 208. Edge profile 210 includes a first convex curve 216 that joins edge 206 of front surface 204, a second convex curve 220 that joins side face 222, and an intermediate concave curve 218 that joins first convex curve 216 and second convex curve 220. Radial direction 460 illustrates a direction that is radial to circumferential edge 208. Perpendicular direction 462 illustrates a direction that is perpendicular to front surface 204.

In the illustrated embodiment, first convex curve 216 has a first endpoint 432 at a first depth 440 below a level of the front surface 204. In one embodiment, at least a portion of intermediate concave curve 218 is below first depth 440. In one embodiment, first depth 440 is equal to or less than 150 microns. In one embodiment, first depth 440 is equal to or less than 100 microns. In one embodiment, first depth 440 is equal to or less than 50 microns. In other embodiments, first depth 440 can have other suitable values.

In the illustrated embodiment, second convex curve 220 joins side face 222 at a second endpoint 438 that is at a second depth 444 below the level of front surface 204. The second depth 444 is greater than the first depth 440. Intermediate concave curve 218 joins the second convex curve 220 at an intermediate endpoint 436 that is at an intermediate depth 442 below the level of front surface 204. In the illustrated embodiment, intermediate depth 442 is greater than first depth 440 and less than second depth 444. In other embodiments, intermediate depth 442 can be less than first depth 440.

In the illustrated embodiment, first convex curve 216 meets edge 206 of front surface 204 at a first radial distance 426 from side face 222 of circumferential edge 208. First endpoint 432 is at a second radial distance 430 from side face 222. Intermediate endpoint 436 is at a third radial distance 434 from side face 222. In the illustrated embodiments, first radial distance 426 is greater than second radial distance 430, and second radial distance 430 is greater than third radial distance 434. In other embodiments, first radial distance 426, second radial distance 430 and third radial distance 434 can have other suitable relationships.

In the illustrated embodiment, first convex curve 216 has a radius of curvature that is illustrated by radius arrow 446. This radius of curvature is positive because the center of the radius of curvature illustrated by radius arrow 446 is within wafer 200 or within substrate 102 of wafer 200. In various embodiments, first convex curve 216 has a radius of curvature that is continuously changing from high values at edge 206 and first endpoint 432 and a low value or minimum value at a point between edge 206 and first endpoint 432. In one embodiment, the minimum value occurs at a midpoint between edge 206 and first endpoint 432 and is illustrated by the position of radius arrow 446 in FIG. 4. In one embodiment, a minimum radius of curvature of first convex curve 216 is equal to or less than first depth 440. In other embodiments, a minimum radius of curvature of first convex curve 216 is greater than first depth 440. In some embodiments, first convex curve 216 has a radius of curvature that does not change. In other embodiments, first convex curve 216 has a radius of curvature that is changing between one or more high values and one or more low values.

In the illustrated embodiment, second convex curve 220 has a radius of curvature that is illustrated by radius arrow 450. This radius of curvature is positive because the center of the radius of curvature illustrated by radius arrow 450 is within wafer 200 or within substrate 102 of wafer 200. In various embodiments, second convex curve 220 has a radius of curvature that is continuously changing from high values at intermediate endpoint 436 and second endpoint 438 and a low value or minimum value at a point between intermediate endpoint 436 and second endpoint 438. In one embodiment, the minimum value occurs at a midpoint between intermediate endpoint 436 and second endpoint 438 and is illustrated by the position of radius arrow 450 in FIG. 4. In other embodiments, second convex curve 220 has a radius of curvature that does not change. In other embodiments, second convex curve 220 has a radius of curvature that is changing between one or more high values and one or more low values. In the illustrated embodiment, a minimum radius of curvature 446 of first convex curve 216 is less than the minimum radius of curvature 450 of the second convex curve 220.

In the illustrated embodiment, intermediate concave curve 218 has a radius of curvature that is illustrated by radius arrow 448. This radius of curvature is negative because the center of the radius of curvature illustrated by radius arrow 448 is outside of wafer 200 or outside of substrate 102 of wafer 200. In various embodiments, intermediate concave curve 218 has a radius of curvature that is continuously changing from high values at first endpoint 432 and intermediate endpoint 436 and a low value or minimum value at a point between first endpoint 432 and intermediate endpoint 436. In one embodiment, the minimum value occurs at a midpoint between first endpoint 432 and intermediate endpoint 436 and is illustrated by the position of radius arrow 448 in FIG. 4. In other embodiments, intermediate concave curve 218 has a radius of curvature that does not change. In other embodiments, intermediate concave curve 218 has a radius of curvature that is changing between one or more high values and one or more low values.

In the illustrated embodiment, intermediate concave curve 218 joins first convex curve 216 at first endpoint 432. In one embodiment, first convex curve 216 and at least a portion 452 of intermediate concave curve 218 have a positive gradient. Portion 452 is the part of intermediate concave curve 218 that joins first convex curve 216. The gradient is defined as the ratio of the change in vertical direction 454 to the change in radial direction 460 for portion 452 of intermediate concave curve 218 and for first convex curve 216.

Figure 5:
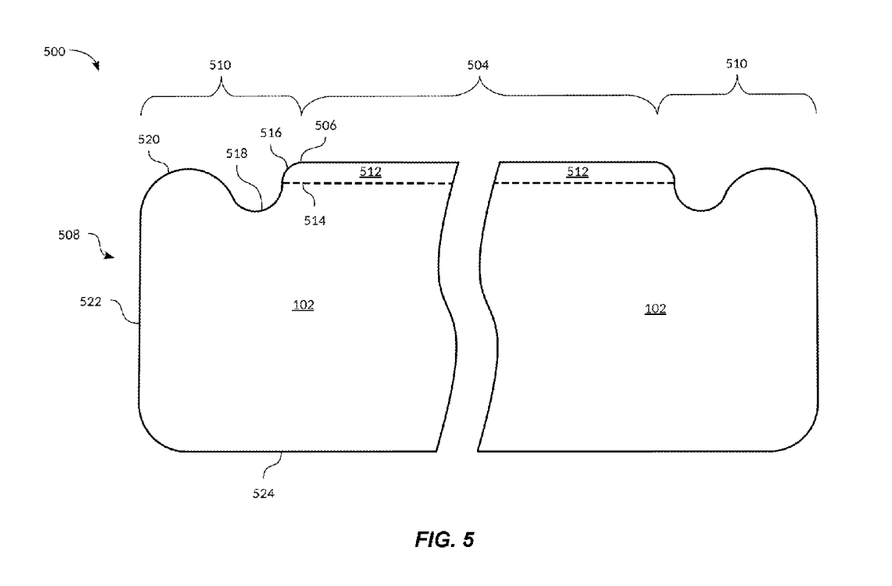
FIG. 5 illustrates a cross-sectional view of an embodiment of a wafer having a curved edge profile.

FIG. 5 illustrates at 500 a cross-sectional view of an embodiment of wafer 100 illustrated in FIG. 1. Wafer 500 includes a front surface 504, a back surface 524 and an edge 508 that is between front surface 504 and back surface 524. Edge 508 includes a curved edge profile 510 between edge 506 of front surface 504 and a side face 522 of edge 508. Edge profile 510 includes a first convex curve 516 that joins edge 506 of front surface 504, a second convex curve 520 that joins side face 522, and an intermediate concave curve 518 that joins first convex curve 516 and second convex curve 520.

FIG. 5 illustrates an embodiment of wafer 500 before wafer thinning has been performed. The dash line at 514 illustrates a final wafer thickness after wafer 500 has been thinned, and substrate portion 512 illustrates the portion of substrate 102 that remains after thinning. After thinning, substrate portion 512 of wafer 500 includes front surface 504 and first convex curve 516 that joins edge 506 of front surface 504. The dash line at 514 corresponds to a back surface of wafer 500 after thinning (see also, FIG. 3).

Figure 5A:
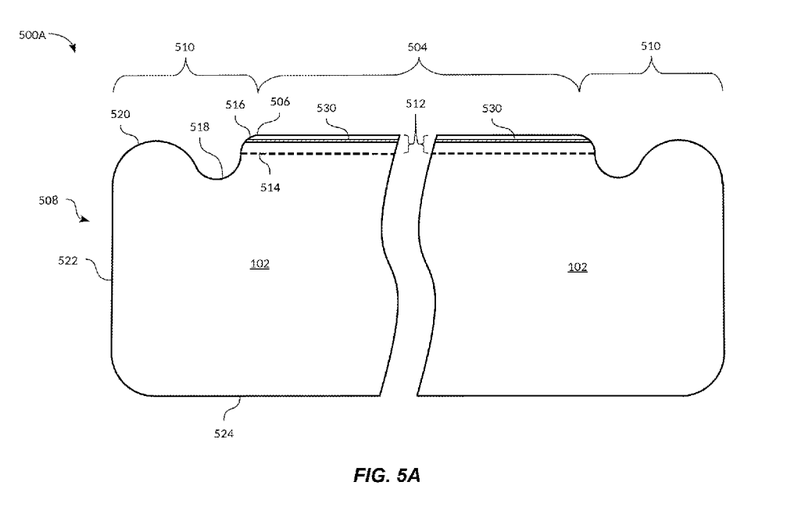
FIG. 5A illustrates a cross-sectional view of an embodiment of the wafer illustrated in FIG. 5.

FIG. 5A illustrates at 500A a cross-sectional view of an embodiment of wafer 500 illustrated in FIG. 5. In this embodiment, wafer 500 is an SOI wafer that includes a buried oxide layer 530. Buried oxide layer 530 is below front surface 504 and above dash line 514. In other embodiments, buried oxide layer 530 can be below dash line 514.

Figure 6:
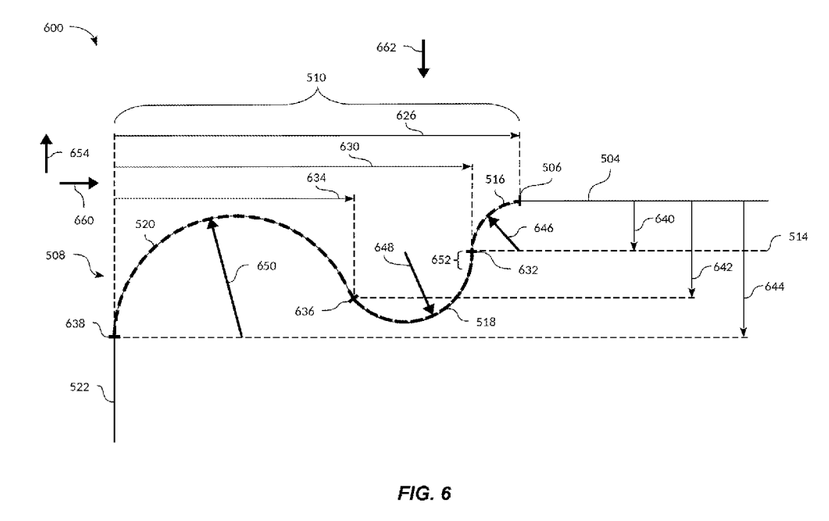
FIG. 6 illustrates a cross-sectional view of the embodiment of the curved edge profile illustrated in FIG. 5 and FIG. 5A.

FIG. 6 illustrates at 600 a cross-sectional view of the embodiment of the curved edge profile 510 illustrated in FIG. 5 and FIG. 5A. Edge 508 includes a curved edge profile 510 between edge 506 of front surface 504 and side face 522 of edge 508. Edge profile 510 includes a first convex curve 516 that joins edge 506 of front surface 504, a second convex curve 520 that joins side face 522, and an intermediate concave curve 518 that joins first convex curve 516 and second convex curve 520. Radial direction 660 illustrates a direction that is radial to circumferential edge 508. Perpendicular direction 662 illustrates a direction that is perpendicular to front surface 504.

In the illustrated embodiment, first convex curve 516 has a first endpoint 632 at a first depth 640 below a level of the front surface 504. In one embodiment, at least a portion of intermediate concave curve 518 is below first depth 640. In one embodiment, first depth 640 is equal to or less than 150 microns. In one embodiment, first depth 640 is equal to or less than 100 microns. In one embodiment, first depth 640 is equal to or less than 50 microns. In other embodiments, first depth 640 can have other suitable values.

In the illustrated embodiment, second convex curve 520 joins side face 522 at a second endpoint 638 that is at a second depth 644 below the level of front surface 504. The second depth 644 is greater than the first depth 640. Intermediate concave curve 518 joins the second convex curve 520 at an intermediate endpoint 636 that is at an intermediate depth 642 below the level of front surface 504. In the illustrated embodiment, intermediate depth 642 is greater than first depth 640 and less than second depth 644. In other embodiments, intermediate depth 642 can be less than first depth 640.

In the illustrated embodiment, first convex curve 516 meets edge 506 of front surface 504 at a first radial distance 626 from side face 522 of circumferential edge 508. First endpoint 632 is at a second radial distance 630 from side face 522. Intermediate endpoint 636 is at a third radial distance 634 from side face 522. In the illustrated embodiments, first radial distance 626 is greater than second radial distance 630, and second radial distance 630 is greater than third radial distance 634. In other embodiments, first radial distance 626, second radial distance 630 and third radial distance 634 can have other suitable relationships.

In the illustrated embodiment, first convex curve 516 has a radius of curvature that is illustrated by radius arrow 646. This radius of curvature is positive because the center of the radius of curvature illustrated by radius arrow 646 is within wafer 500 or within substrate 102 of wafer 500. In various embodiments, first convex curve 516 has a radius of curvature that is continuously changing from high values at edge 506 and first endpoint 632 and a low value or minimum value at a point between edge 506 and first endpoint 632. In one embodiment, the minimum value occurs at a midpoint between edge 506 and first endpoint 632 and is illustrated by the position of radius arrow 646 in FIG. 6. In one embodiment, a minimum radius of curvature of first convex curve 516 is equal to or less than first depth 640. In other embodiments, a minimum radius of curvature of first convex curve 516 is greater than first depth 640. In some embodiments, first convex curve 516 has a radius of curvature that does not change. In other embodiments, first convex curve 516 has a radius of curvature that is changing between one or more high values and one or more low values.

In the illustrated embodiment, second convex curve 520 has a radius of curvature that is illustrated by radius arrow 650. This radius of curvature is positive because the center of the radius of curvature illustrated by radius arrow 650 is within wafer 500 or within substrate 102 of wafer 500. In various embodiments, second convex curve 520 has a radius of curvature that is continuously changing from high values at intermediate endpoint 636 and second endpoint 638 and a low value or minimum value at a point between intermediate endpoint 636 and second endpoint 638. In one embodiment, the minimum value occurs at a midpoint between intermediate endpoint 636 and second endpoint 638 and is illustrated by the position of radius arrow 650 in FIG. 6. In other embodiments, second convex curve 520 has a radius of curvature that does not change. In other embodiments, second convex curve 520 has a radius of curvature that is changing between one or more high values and one or more low values. In the illustrated embodiment, a minimum radius of curvature 646 of first convex curve 516 is less than the minimum radius of curvature 650 of the second convex curve 520.

In the illustrated embodiment, intermediate concave curve 518 has a radius of curvature that is illustrated by radius arrow 648. This radius of curvature is negative because the center of the radius of curvature illustrated by radius arrow 648 is outside of wafer 500 or outside of substrate 102 of wafer 500. In various embodiments, intermediate concave curve 518 has a radius of curvature that is continuously changing from high values at first endpoint 632 and intermediate endpoint 636 and a low value or minimum value at a point between first endpoint 632 and intermediate endpoint 636. In one embodiment, the minimum value occurs at a midpoint between first endpoint 632 and intermediate endpoint 636 and is illustrated by the position of radius arrow 648 in FIG. 6. In other embodiments, intermediate concave curve 518 has a radius of curvature that does not change. In other embodiments, intermediate concave curve 518 has a radius of curvature that is changing between one or more high values and one or more low values.

In the illustrated embodiment, intermediate concave curve 518 joins first convex curve 516 at first endpoint 632. In one embodiment, first convex curve 516 and at least a portion 652 of intermediate concave curve 518 have a positive gradient. Portion 652 is the part of intermediate concave curve 518 that joins first convex curve 516. The gradient is defined as the ratio of the change in vertical direction 654 to the change in radial direction 660 for portion 652 of intermediate concave curve 518 and for first convex curve 616.

Figure 7:
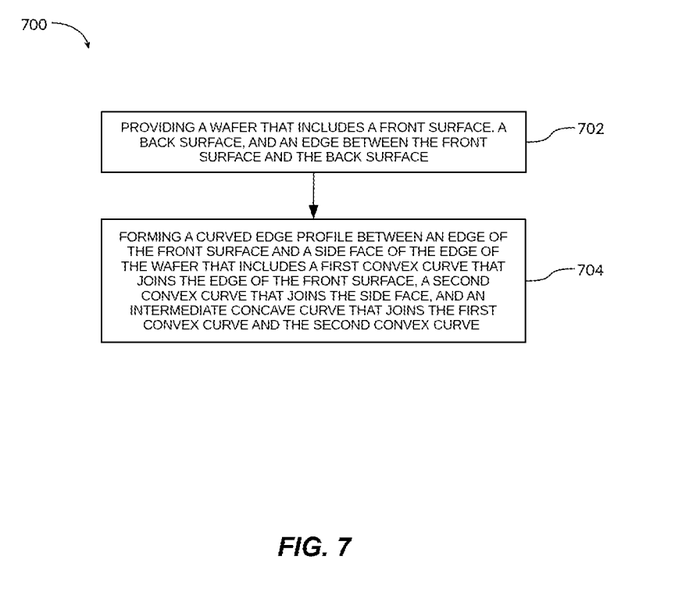
FIG. 7 illustrates a flowchart of an embodiment of a method of forming a wafer having a curved edge profile.

FIG. 7 illustrates a flowchart of an embodiment of a method of forming a wafer having a curved edge profile. The method is illustrated at 700. At 702, a wafer 200 is provided that includes a front surface 204, a back surface 224 and an edge 208 between the front surface 204 and the back surface 224. At 704, a curved edge profile 210 is formed between an edge 206 of the front surface 204 and a side face 222 of edge 208 of wafer 200. Curved edge profile 210 includes a first convex curve 216 that joins edge 206 of front surface 204, a second convex curve 220 that joins side face 222, and an intermediate concave curve 218 that joins first convex curve 216 and the second convex curve 220.

In one embodiment, forming curved edge profile 210 includes forming first convex curve 216 to have a minimum radius of curvature 446 that is less than the minimum radius of curvature 450 of the second convex curve 220. In one embodiment, forming the curved edge profile 210 includes forming the first convex curve 216 to have a first endpoint 432 that is at a first depth 440 below a level of the front surface 204. In one embodiment, forming curved edge profile 210 includes forming the first convex curve 216 to have a minimum radius of curvature that is equal to or less than first depth 440. In another embodiment, the minimum radius of curvature of first convex curve 216 is greater than first depth 440. In one embodiment, first depth 440 is equal to or less than 150 microns. In one embodiment, first depth 440 is equal to or less than 100 microns. In one embodiment, first depth 440 is equal to or less than 50 microns. In other embodiments, first depth 440 can have other suitable values.

In one embodiment, forming curved edge profile 210 includes forming second convex curve 220 to join side face 222 at a second depth 444 below the level of front surface 204. In this embodiment, second depth 444 is greater than the first depth 440. In one embodiment, forming curved edge profile 210 includes forming intermediate concave curve 218 to join the second convex curve 220 at an intermediate depth 442 below the level of the front surface 204. In this embodiment, intermediate depth 442 is greater than first depth 440 and is less than second depth 444.

In one embodiment, forming curved edge profile 210 includes forming edge 208 of wafer 200 in radial direction 460 to form convex curve 216, convex curve 220, and intermediate curve 218. In this embodiment, radial direction 460 includes directions having angular deviations from radial direction 460 that are up to and include 30°. In one embodiment, forming curved edge profile 210 can be accomplished by a grinding process that utilizes a wafer edge grinding wheel. In one embodiment, the edge grinding wheel has a surface shape that is an inverse of curved edge profile 210. In one embodiment, edge 208 of wafer 200 can be formed in perpendicular direction 462 to form convex curve 216, convex curve 220, and intermediate concave curve 218. In this embodiment, perpendicular direction 462 includes directions having angular deviations from perpendicular direction 462 that are up to and include 30°.

In one embodiment, forming curved edge profile 210 includes forming edge 208 of wafer 200 in radial direction 460 to form at least a portion of convex curve 216 and convex curve 220, and forming edge 208 of wafer 200 in perpendicular direction 462 to form intermediate concave curve 218. In this embodiment, radial direction 460 includes directions having angular deviations from radial direction 460 that are up to and include 30°. In this embodiment, perpendicular direction 462 includes directions having angular deviations from perpendicular direction 462 that are up to and include 30°. In various embodiments, forming curved edge profile 210 can be accomplished by a grinding process that utilizes a wafer edge grinding wheel applied in radial direction 460, perpendicular direction 462, or both radial direction 460 and perpendicular direction 462. In one embodiment, the edge grinding wheel has a surface shape that is an inverse of curved edge profile 210. In other embodiments, convex curve 216, convex curve 220, and intermediate concave curve 218 can be formed sequentially or individually in radial direction 460, perpendicular direction 462, or both radial direction 460 and perpendicular direction 462. In other embodiments, curved edge profile 210 can be formed using other suitable approaches.

In one embodiment, forming curved edge profile 510 includes forming edge 508 of wafer 500 in radial direction 660 to form convex curve 516, convex curve 520, and intermediate curve 518. In this embodiment, radial direction 660 includes directions having angular deviations from radial direction 660 that are up to and include 30°. In one embodiment, forming curved edge profile 510 can be accomplished by a grinding process that utilizes a wafer edge grinding wheel. In one embodiment, the edge grinding wheel has a surface shape that is an inverse of curved edge profile 510. In one embodiment, edge 508 of wafer 500 can be formed in perpendicular direction 662 to form convex curve 516, convex curve 520, and intermediate concave curve 518. In this embodiment, perpendicular direction 662 includes directions having angular deviations from perpendicular direction 662 that are up to and include 30°.

In one embodiment, forming curved edge profile 510 includes forming edge 508 of wafer 500 in radial direction 660 to form at least a portion of convex curve 516 and convex curve 520, and forming edge 508 of wafer 500 in perpendicular direction 662 to form intermediate concave curve 518. In this embodiment, radial direction 660 includes directions having angular deviations from radial direction 660 that are up to and include 30°. In this embodiment, perpendicular direction 662 includes directions having angular deviations from perpendicular direction 662 that are up to and include 30°. In various embodiments, forming curved edge profile 510 can be accomplished by a grinding process that utilizes a wafer edge grinding wheel applied in radial direction 660, perpendicular direction 662, or both radial direction 660 and perpendicular direction 662. In one embodiment, the edge grinding wheel has a surface shape that is an inverse of curved edge profile 510. In other embodiments, convex curve 516, convex curve 520, and intermediate concave curve 518 can be formed sequentially or individually in radial direction 660, perpendicular direction 662 or both radial direction 660 and perpendicular direction 662. In other embodiments, curved edge profile 510 can be formed using other suitable approaches.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A wafer comprising:
    a front surface;
    a back surface; and
    an edge between the front surface and the back surface, the edge having a curved edge profile between an edge of the front surface and a side face of the edge of the wafer, wherein the curved edge profile includes
        a first convex curve that joins the edge of the front surface,
        a second convex curve that joins the side face, and
        an intermediate concave curve that joins the first convex curve and the second convex curve, wherein the second convex curve includes an intermediate endpoint at an intermediate depth from the front surface, wherein the intermediate concave curve includes a first endpoint at a first depth from the front surface, wherein the intermediate depth is greater than the first depth, and wherein the first convex curve and at least a portion of the intermediate concave curve have a positive gradient.

2. The wafer of claim 1, wherein a minimum radius of curvature of the first convex curve is less than the minimum radius of curvature of the second convex curve.

3. The wafer of claim 1, wherein the first convex curve and at least a portion of the intermediate concave curve have a positive gradient.

4. The wafer of claim 1, wherein the intermediate concave curve joins the first convex curve at a first depth below a level of the front surface.

5. The wafer of claim 4, wherein a minimum radius of curvature of the first convex curve is equal to or less than the first depth.

6. The wafer of claim 4, wherein the second convex curve joins the side face at a second depth below the level of the front surface, and wherein the second depth is greater than the first depth.

7. The wafer of claim 6, wherein the intermediate concave curve joins the second convex curve at an intermediate depth below the level of the front surface, and wherein the intermediate depth is greater than the first depth and less than the second depth.

8. The wafer of claim 4, wherein the first depth is equal to or less than 150 microns.

9. A wafer, comprising:
    a front surface;
    a back surface; and
    a circumferential edge between the front surface and the back surface, the circumferential edge having a curved edge profile between an edge of the front surface and a side face of the circumferential edge of the wafer, wherein the curved edge profile includes
        a first convex curve that joins the edge of the front surface at a first radial distance from the side face,
        a second convex curve that joins the side face, and
        an intermediate concave curve between the first convex curve and the second convex curve, wherein the intermediate concave curve joins the first convex curve at a second radial distance from the side face and joins the second convex curve at a third radial distance from the side face, and wherein the first radial distance is greater than the second radial distance and the second radial distance is greater than the third radial distance, wherein the second convex curve includes an intermediate endpoint at an intermediate depth from the front surface, wherein the intermediate concave curve includes a first endpoint at a first depth from the front surface, wherein the intermediate depth is greater than the first depth, and wherein the first convex curve and at least a portion of the intermediate concave curve have a positive gradient.

10. The wafer of claim 9, wherein a minimum radius of curvature of the first convex curve is less than the minimum radius of curvature of the second convex curve.

11. The wafer of claim 9, wherein the first convex curve and at least a portion of the intermediate concave curve have a positive gradient.

12. The wafer of claim 9, wherein the intermediate concave curve joins the first convex curve at a first depth below a level of the front surface.

13. The wafer of claim 12, wherein a minimum radius of curvature of the first convex curve is equal to or less than the first depth.

14. The wafer of claim 12, wherein the second convex curve joins the side face at a second depth below the level of the front surface, and wherein the second depth is greater than the first depth.

15. The wafer of claim 14, wherein the intermediate concave curve joins the second convex curve at an intermediate depth below the level of the front surface, and wherein the intermediate depth is greater than the first depth and less than the second depth.

16. A method of forming a wafer, comprising:
providing a wafer that includes a front surface, a back surface, and an edge between the front surface and the back surface; and
forming a curved edge profile between an edge of the front surface and a side face of the edge of the wafer, the curved edge profile including a first convex curve that joins the edge of the front surface, a second convex curve that joins the side face, and an intermediate concave curve that joins the first convex curve and the second convex curve, wherein the second convex curve includes an intermediate endpoint at an intermediate depth from the front surface, wherein the intermediate concave curve includes a first endpoint at a first depth from the front surface, wherein the intermediate depth is greater than the first depth, and wherein the first convex curve and at least a portion of the intermediate concave curve have a positive gradient.

17. The method of claim 16, wherein forming the curved edge profile comprises forming the edge of the wafer in a direction radial to the edge to form the first convex curve, the second convex curve, and the intermediate concave curve.

18. A method of claim 16, wherein forming the curved edge profile comprises:
forming the edge of the wafer in a direction radial to the edge to form at least a portion of the first convex curve and the second convex curve; and
forming the edge of the wafer in a direction perpendicular to the front surface to form the intermediate concave curve.

19. A method of claim 16, wherein forming the curved edge profile comprises forming the first convex curve to have a minimum radius of curvature that is less than the minimum radius of curvature of the second convex curve.

20. A method of claim 16, wherein forming the curved edge profile comprises forming the
intermediate concave curve to join the first convex curve at a first depth below a level of the front surface.

21. A method of claim 20, wherein forming the curved edge profile comprises forming the first convex curve to have a minimum radius of curvature that is equal to or less than the first depth.

22. A method of claim 20, wherein forming the curved edge profile comprises forming the second convex curve to join the side face at a second depth below the level of the front surface, and wherein the second depth is greater than the first depth.

23. A method of claim 22, wherein forming the curved edge profile comprises forming the intermediate concave curve to join the second convex curve at an intermediate depth below the level of the front surface, and wherein the intermediate depth is greater than the first depth and less than the second depth.

* * * * *